United States Patent [19]

Imaizumi et al.

[11] Patent Number: 4,629,515
[45] Date of Patent: Dec. 16, 1986

[54] SUPERCONDUCTIVE MATERIALS AND PROCESS FOR THE PRODUCTION THEREOF

[75] Inventors: Mitsuyuki Imaizumi; Kiyoshi Yoshizaki, both of Kanagawa, Japan

[73] Assignee: Mitsubishi Denki Kabushiki Kaisha, Tokyo, Japan

[21] Appl. No.: 456,085
[22] PCT Filed: Apr. 28, 1982
[86] PCT No.: PCT/JP82/00144
§ 371 Date: Dec. 30, 1982
§ 102(e) Date: Dec. 30, 1982
[87] PCT Pub. No.: WO82/03941
PCT Pub. Date: Nov. 11, 1982

[30] Foreign Application Priority Data

Apr. 30, 1981 [JP] Japan ................. 56-065763
Jun. 1, 1981 [JP] Japan ................. 56-84061

[51] Int. Cl.$^4$ ............................ H01L 39/24
[52] U.S. Cl. ................. 148/11.5 F; 29/599; 148/11.5 P; 148/11.5 Q
[58] Field of Search ......... 148/11.5 R, 11.5 F, 148/11.5 P, 11.5 Q, 133; 29/599; 420/901; 428/614; 156/656

[56] References Cited

U.S. PATENT DOCUMENTS

| | | | |
|---|---|---|---|
| 3,763,553 | 10/1973 | Barber et al. | 29/599 |
| 4,050,147 | 9/1977 | Winter et al. | 75/0.5 BB |
| 4,073,666 | 2/1978 | Marancik et al. | 148/11.5 R |
| 4,084,989 | 4/1978 | Meyer | 148/11.5 Q |
| 4,103,075 | 7/1978 | Adam | 428/614 |
| 4,223,434 | 9/1980 | Wang et al. | 148/11.5 P |
| 4,242,536 | 12/1980 | Young | 29/599 |
| 4,323,402 | 4/1982 | Tachikawa et al. | 148/133 |
| 4,411,959 | 10/1983 | Braginski et al. | 428/930 |
| 4,419,125 | 12/1983 | Charles et al. | 29/599 |

FOREIGN PATENT DOCUMENTS

| | | |
|---|---|---|
| 3291 | 1/1973 | Japan . |
| 45192 | 6/1973 | Japan . |
| 32596 | 3/1974 | Japan . |
| 79493 | 7/1978 | Japan ................. 29/599 |
| 1092467 | 11/1967 | United Kingdom ......... 148/11.5 Q |

OTHER PUBLICATIONS

Suenaga et al, *Filamentary A15 Superconductors*, Roberge et al., "In Situ and Powder Metallurgy Multifilamentary Superconductors Fabrication and Properties", Plenum Press, N.Y., 1980, pp. 241-257.

Madsen et al., "The Effect of Heat Treatment on the Superconducting Properties of a Multifilamentary Nb$_3$Sn composite", IEEE Transactions on Magnetics, vol. Mag-15, No. 1, Jan. 1979, pp. 182-184.

Arihama et al, "Nb-Al Multifilamentary Superconducting Composites Produced by Powder Processing", Appl. Phys. Lett. 37(12), Dec. 1980, pp. 1107-1109.

*Primary Examiner*—Peter K. Skiff
*Attorney, Agent, or Firm*—Sughrue, Mion, Zinn, Macpeak, and Seas

[57] ABSTRACT

A superconductive substance is produced by fabricating any one metal (17) of niobium and vanadium and an easily deformable metal (16) such as Cu into one piece and working it to produce a composite metallic wire, chemically dissolving and removing the easily deformable metal (16) from the composite metallic wire, and then depositing a tin or gallium-base metal (18) and applying heat treatment.

Also, a process for producing a superconductive substance comprising fabricating any one metal of niobium and vanadium and an easily deformable metal such as Cu containing at least one metal of tin and gallium into one piece and working it to produce a composite metallic material, heat treating the composite metallic material to form a superconductive substance, and then chemically dissolving and removing the easily deformable metal as a non-conductive substance from the composite metallic material is disclosed. A superconductive material produced by providing a metal having a high mechanical strength around the superconductive substance so as to directly envelop it and a process for producing the same are also disclosed.

10 Claims, 8 Drawing Figures

SUPERCONDUCTIVE MATERIALS AND PROCESS FOR THE PRODUCTION THEREOF

TECHNICAL FIELD

The present invention relates to superconductive materials which are hardly deteriorated in superconductive characteristics even when deformed by mechanical stress and which can be produced on commercial scale, and a process for the production of superconductive substances which are to be used in the production of such superconductive materials.

BACKGROUND ART

Utilization of superconductive equipment in a wide variety of applications—e.g., as apparatus associated with the generation of energy, such as a nuclear fusion reactor, a superconductive generator, and an apparatus for the storage of electric power; high energy physical apparatus, such as an accelerator; transportation equipment such as a magnetic floating train and an appratus for propelling ships; and medical apparatus, such as an apparatus for treating diseases using $\pi$-meson—has been gradually realized. With a great advance in such equipment and the production of large sized apparatus, it has been desired to develop superconductive materials which are capable of withstanding high magnetic fields and high-speed excitation.

For example, in magnetic fields as high as at least 8 tesla, there are usually employed superconductive wires which are made of compounds, such as Nb$_3$Sn and V$_3$Ga, having excellent high magnetic field characteristics. These wires, however, have the disadvantage that they are mechanically brittle. Therefore, various improved processes for the production of such superconductive wires have been proposed to overcome the above-described problem. For example, discontinuous fiber-shaped superconductive wire materials have been produced. These superconductive wire materials are produced by a process comprising solidifying a copper-base alloy containing low concentrations of niobium and tin components by rapidly cooling to finely disperse niobium particles in the matrix of copper, drawing the thus-formed alloy to form niobium fibers, and then applying heat treatment on the surface of the niobium fiber to form Nb$_3$Sn, or alternatively, a process comprising press sintering a mixture of niobium powder and copper and tin powders, or a coppertin alloy powder, producing fine short fibers, and then applying heat treatment on the surface of the fine short fiber to form Nb$_3$Sn.

In the discontinuous fiber-shaped superconductive wire materials produced by the above-described processes, eletric current is allowed to pass therethrough by the adjacent effect of discontinuous fiber-shaped superconductive substances. Therefore, even if the wire materials are deformed by the action of electromagnetic force, their superconductive current characteristics are not reduced as long as the distance between the superconductive substances is maintained at a lower level than a predetermined value.

In order to produce the above-described excellent discontinuous fiber-shaped superconductive wire materials or superconductive materials, it is necessary to use powdery or short fiber-shaped superconductive substances having excellent superconductive characteristics. An industrial method of production of such superconductive substances has not yet been established.

DISCLOSURE OF INVENTION

An object of the invention is to provide a process permitting industrial production of powdery or fibrous superconductive substances having excellent superconductive characteristics.

Another object of the invention is to provide excellent superconductive materials which are made of superconductive substances produced by the above-described process.

Superconductive substances include A 15 type compounds, such as Nb$_3$Sn, Nb$_3$Ge, Nb$_3$Al, V$_3$Ge, V$_3$Ga, and V$_3$Si, C 15 type compounds, such as HfV$_2$, NaCl type compounds, such as NbC and NbN, oxides, such as BaPb$_{1-x}$Bi$_x$O$_3$ and Li$_{1+x}$Ti$_{2-x}$O$_4$, and Chevrel phase compounds, such as PbMo$_6$S$_8$. These substances are used in a powdery or fibrous form in which the side or diameter is from several microns to several ten Angstroms (Å).

These powdery or fibrous superconductive substances are produced by a process comprising the steps of: working a composite metal comprising a niobium or vanadium-base high melting point component and an easily workable metal, e.g., Cu, Sn, Ga, a Cu-Sn alloy, and a Cu-Ga alloy, so as to reduce the cross-sectional area of the composite metal to produce a composite metallic wire material; removing the easily workable metal from the composite metallic wire material to produce a niobium or vanadium-base metallic fiber; and providing a tin or gallium-base low melting point component on the metallic fiber and applying heat treatment to produce the desired superconductive compound.

The above-described heat treatment includes a step of mixing the niobium or vanadium-base metallic fiber with a powdery or fibrous tin or gallium-base metal, or a step of providing a tin or gallium-base metal on the niobium or vanadium-base metallic fiber by techniques such as electrodeposition, vacuum deposition, and deposition.

These powdery or fibrous superconductive substances can be produced by a process different from the above-described one. This is a process for the production of superconductive substances which comprises combining any one of niobium and vanadium and an easily wokable metal and working the thus-formed metallic material to produce a composite metallic material; heat treating the composite metallic material to form a superconductive substance; and then chemically dissolving and removing non-superconductive substances in the composite metallic material.

The working process of forming the above-described composite metallic material and the heat treatment to form the superconductive substance are repeated at least once.

Metals having high mechanical strengths include Cu-Ni alloys, such as cupronickel containing 10 to 30% by weight Ni and Monel metal containing 30 to 40% by weight Cu, precipitation hardening copper alloys, such as Cu-Be and Cu-Ti, non-magnetic stainless steels, such as SUS 304 and SUS 316, and metals having excellent cold working properties, e.g., Nb and Ta.

BEST MODE FOR CARRYING OUT THE INVENTION

EXAMPLE 1

This example relates to applying a metal around superconductive fibers or powders as produced in accordance with the remaining examples herein.

Figure 1:
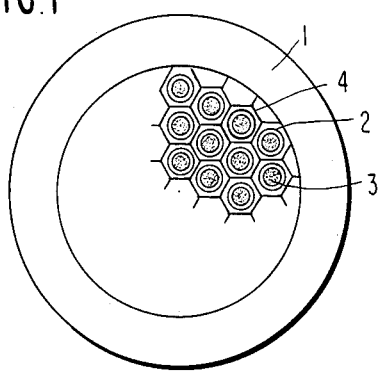
FIG. 1 is a cross-sectional view of a billet comprising a copper container and a plurality of composite metallic wire materials placed in the container, showing an example of the invention.

$Nb_3Sn$ powder 3 in a fibrous form having a diameter of 500–3,200 Å and a length of 0.5–5 μm was placed in a 30% by weight Cu-containing nickel pipe (cupronickel pipe) 2, which was in turn covered with a copper pipe 4 having an outer diameter of 3.2 mm and an inner diamter of 11.8 mm. The thus-formed composite metal was cold drawn to produce a wire material having an outer diameter of 3 mm. Then, the wire material was worked so that it had a hexagonal cross-section in which the distance between the opposite sides was 2.8 mm. These wire materials (127) were, as shown in FIG. 1, placed in a copper container 1 having an outer diameter of 50 mm and an inner diameter of 37.5 mm and hot extruded at 650° C. to produce a wire material having an outer diameter of 20 mm. Finally the wire material was cold drawn to produce a round wire having a diameter of 0.5 mm and then twisted at a pitch of 20 mm to produce a discontinuous fiber type $Nb_3Sn$ wire material of the invention.

The thus-obtained discontinuous fiber type $Nb_3Sn$ wire material was bent in liquid helium having a temperature of 4.2 K while applying a bias magnetic field of 12 tesla. The critical current density of $Nb_3Sn$ compound in the cupronickel pipe was measured, and the results are shown in FIG. 2 (Curve A).

For comparison, the critical current density of each of a commercially available continuous fibrous fine cored wire and a discontinuous fiber type $Nb_3Sn$ wire material produced by a conventional method was measured under the same conditions as described above. The results are shown in FIG. 2 as Curves B and C, respectively.

Figure 2:
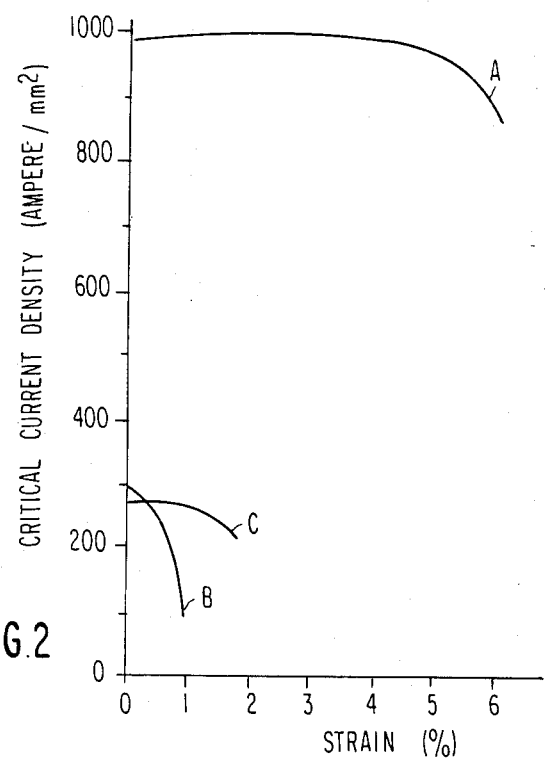
FIG. 2 is a characteristic view showing the changes in critical current density of a superconductive wire material of the invention, a superconductive wire material available on the market, and a superconductive wire material produced by a conventional method.

As apparent from FIG. 2, the discontinuous fiber type $Nb_3Sn$ wire material of the invention is improved to the extent that its critical current density at a strain of 0 is several times those of the commercially available wire material and the wire material produced by the conventional method. The reason for this is that the wire material of the invention does not contain non-superconductive substances such as Cu-Sn bronze in the cupronickel pipe unlike conventional wires, but is made substantially of the $Nb_3Sn$ substance. Furthermore, the critical current density of the wire material of the invention does not decrease even at a strain of 5%, whereas with the wire material produced by the conventional method the critical current density decreases at a strain of 1%. This is because the wire material of the invention is composed of fine $Nb_3Sn$ fibrous powder. As described above, the discontinuous fiber type $Nb_3Sn$ wire material of the invention possesses excellent superconductive characteristics, which are hardly deteriorated even when a mechanical stress is applied.

The copper pipe 4 was used to cover the cupronickel pipe 2 for the purpose of rapidly transmitting the heat generated by flux jump, for example, in the outer diameter direction. In addition, pipes made of aluminum or silver can be used with the same effect as above. However, it is not always necessary to provide such pipes.

In Example 1, as described above, the superconductive material is constructed so that a metal having a high mechanical strength is provided around the superconductive substance. Since the superconductive material does not contain non-superconductive substances such as Cu-Sn bronze which are contained in the conventional superconductive material of this type, is greatly increased in current density per unit cross-sectional area, and further, is simplified in the structure, it can be produced on a commercial scale. In an electromagnet, for example, produced by winding the superconductive wire material of the invention, even when the wire material is deformed under the influences of great electromagnetic force, the adjacent effect can be maintained because the powdery superconductive substance moves through sliding and, therefore, a reduction in the current density can be efficiently prevented. Moreover, since a metal having a high resistivity, such as cupronickel, is used as the metal having a high mechanical strength, the alternating current loss due to dynamically changing current and magnetic field, such as pulse magnet, can be greatly reduced. Therefore, the wire material of the invention can be widely utilized as a wire material having high performance and reliability in the production of, e.g., electromagnets which are used at a location where a high electromagnetic force acts.

EXAMPLE 2

Figure 3:
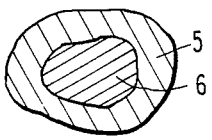
FIG. 3 is a cross-sectional view of a composite powder comprising copper and niobium.

Composite powder having a mean diameter of about 40 μm, comprising Cu 5 and Nb 6 placed in the Cu 5 as shown in FIG. 3, was hot pressed at a temperature of 600°–1,000° C. to produce a composite metallic bar comprising Cu and Nb, the diameter being 20 mm. The composite metallic bar was then cold worked to produce a wire material having a diameter of 0.2 mm, which was in turn chemically treated to remove the Cu metallic layer to obtain an Nb metallic fiber having a mean diameter of about 0.3 μm. Finally the Nb metallic fiber was provided with Sn by electrodeposition and heat treated at 700°–1,000° C. to convert the Nb metallic fiber into an Nb Sn compound fiber which was then ground in a ball mill to produce a powdery $Nb_3Sn$ compound having a mean diameter of about 0.3 μm.

In the course of production of the composite metallic bar in this example, Cu powder or Cu fiber may further be attached. Furthermore, although Sn is deposited on the metallic fiber by electrodeposition in this example, there can be used a vacuum deposition method, a method in which molten Sn is permeated, a method in which Sn powder is merely mixed, and a method in which Sn and Cu are previously formed into an alloy. Grinding of the $Nb_3Sn$ fiber can be performed by various mechanical techniques.

EXAMPLE 3

Figure 4:
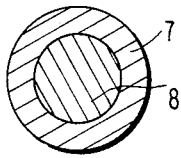
FIGS. 4 and 5 are each a cross-sectional view of an example of composite metallic wires comprising copper and vanadium.
Figure 5:
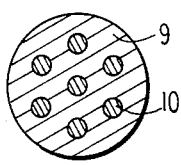

A composite metallic wire comprising Cu 7 and V 8 placed in the Cu 7 as shown in FIG. 4, or a composite metallic wire comprising Cu 9 and a plurality of V core wires 10 (diameter: 50 μm) placed in the Cu 9 as shown in FIG. 5 was placed in a metallic container having a diameter of 100 mm, extruded at 300°–900° C., and cold worked to produce a composite wire having a diameter of 0.1 mm. The thus-produced composite wire was chemically treated to remove the Cu-base metallic layer, producing a V-base metallic fiber having a mean diameter of about 0.05 μm. A Ga-Bu alloy was permeated in a molten state into a bundle of the above-produced V-base metallic fiber which was in turn subjected to heat treatment at 550°–1,000° C. to convert the V-base fiber into a $V_3Ga$ compound fiber. The $V_3Ga$ compound fiber was ground in a ball mill, finally producing a finely minuted $V_3Ga$ compound having a mean diameter of about 0.05 μm.

The $Nb_3Sn$ compound powder and the $V_3Ga$ compound powder produced in Examples 2 and 3 were each processed by the usual method to produce a superconductive wire material. The superconductive characteristics of the superconductive wire material were examined and found very satisfactory.

In order to increase the superconductive characteristics, Hf, Ta, Zr, Ti, etc. are added to the Nb or V-base metallic layer, Mg, In, Si, Al, Pb, etc. are added to the Sn or Ga-base metallic layer, or other harmless metallic elements are added. In these cases, the same effect as described above is obtained.

In addition, the process of this example can be applied to the production of superconductive compounds such as $Nb_3Al$ and $V_3Si$.

EXAMPLE 4

Figure 6:
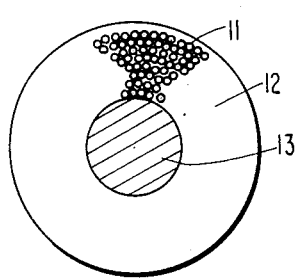

Nb wires 11 (9,120) having a diameter of 110 μm were embedded in a Cu substrate 12 as shown in FIG. 6 to produce a composite metallic pipe having an outer diameter of 50 mm and an inner diameter of 20 mm. An Sn wire material 13 was inserted into the hollow portion of the composite metallic pipe to produce a composite metallic bar. The composite metallic pipe can be easily produced by central machining after hollow hot extrusion or hot extrusion. The composite metallic bar may be produced by pouring molten Sn into the hollow portion of the composite metallic pipe.

The composite metallic bar was then drawn by means of a draw bench, a drawing machine or the like to produce a wire material having an outer diameter of 0.8 mm. The wire material was heat treated within the temperature range of from 650° to 950° C. in an inert gas atmosphere for several ten hours to diffuse Sn through Cu, converting Nb in a fibrous form having a wire diameter of 2 μm or less into $Nb_3Sn$ by a solid reaction. Finally the material was dipped in $HNO_3$ to dissolve and remove Cu-Sn portions except for $Nb_3Sn$, producing a fibrous $Nb_3Sn$ superconductive substance.

The superconductive substance was used to produce a discontinuous fiber-shaped superconductive wire material, and its superconductive characteristics were examined and found very satisfactory.

When it is necessary to adjust the grain size of the above-produced fibrous $Nb_3Sn$ superconductive substance, the superconductive substance is ground into a finer powder form by means of a ball mill, for example. In many cases, the use of a Cu-Sn alloy containing Cu in place of Sn is advantageous from a viewpoint of ease of drawing.

EXAMPLE 5

Figure 7:
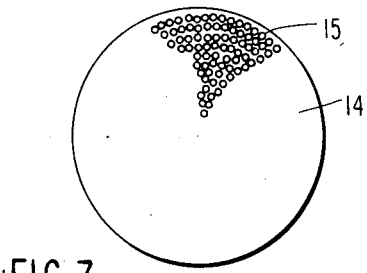
FIGS. 6 to 8 are a cross-sectional view of an example of composite metallic wires comprising copper, tin, and niobium.

In this example, a bronze process was employed, although an internal diffusion process was used in the above examples. That is, a number of Nb bars 15 were embedded in bronze containing 13% by weight or less Sn as shown in FIG. 7 to produce a composite metallic bar. The composite metallic bar was repeatedly subjected to the treatments of hot extrusion and cold drawing softening annealing to reduce its cross-sectional area, producing a composite wire material. Then the composite wire material was heat treated under the same conditions as in Example 4 to form $Nb_3Sn$. Finally Cu-Sn portions were removed by the use of the same etchant as used in the above example to form an $Nb_3Sn$ superconductive substance in a fibrous form. Similarly a discontinuous fiber-shaped superconductive wire material was produced, and its superconductive characteristics were examined and found very satisfactory.

Also, by embedding Nb bars in bronze improved in workability by decreasing the concentration of Sn, working the resulting material to reduce its cross-sectional area, depositing Sn by techniques such as plating to compensate for the deficient Sn, and then, applying heat treatment, a $Nb_3Sn$ superconductive substance can be produced.

EXAMPLE 6

Figure 8:
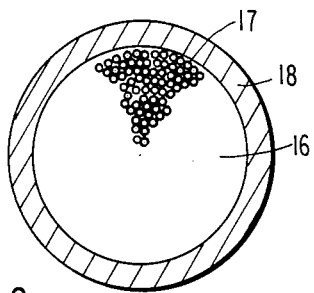

In this example, an external diffusion process was employed. That is, a number of Nb wires 17 were embedded in a Cu substrate 16 as shown in FIG. 8, and the substrate 16 was worked to reduce its cross-sectional area. Sn 18 was deposited thereon by techniques such as electrodeposition and molten plating to adjust to the final dimensions. The resulting material was subjected to the same heat treatment as in Example 4 to form $Nb_3Sn$. Then, Cu-Sn portions were removed by the use of the same etchant as used in Example 4 to form a fibrous $Nb_3Sn$ superconductive substance. The superconductive substance was used to produce a discontinuous fiber-shaped superconductive wire material, and its superconductive characteristics were examined and found very satisfactory.

Although a continuous core wire of Nb is used in Examples 4 to 6, even when the wire is broken in the course of production, or a discontinuous Nb fiber is used from the beginning, a superconductive substance can be produced by application of the process of the invention.

After the formation of $Nb_3Sn$ on part of the surface of the Nb wire by application of heat treatment on the composite metallic material, cold working is applied to break the whole or part of $Nb_3Sn$, and by further applying heat treatment, unreacted Nb and Sn can be reacted. Therefore, even when an Nb core wire having a relatively large diameter, the whole of Nb can be utilized for the formation of $Nb_3Sn$.

Although the invention has been described by reference to a process for the production of superconductive substance of $Nb_3Sn$ in a powdery of short fibrous form in the above examples, it is not limited thereto. For example, when V or a V-base metal is used as the metallic core wire, or Ga or a Cu-Ga alloy is used as the metal which is easily workable and is capable of forming a superconductive substance in combination with the V-base metal, a $V_3Ga$ superconductive substance can be produced by the process of the invention. Similarly, superconductive substances such as $V_3Si$ and $Nb_3Al$ can be produced by the process of the invention.

In addition, the superconductive characteristics can be improved by adding metallic elements, such as Al, Mg, Mn, Ga, Hf, Ta, Zr, etc., to the Nb or V metal and metallic elements, such as Al, In, Mg, Mn, Pb, etc., to the Sn or Ga metal.

The description "chemically dissolving a non-superconductive substance" as used herein means a process in which a composite metallic material is dipped in an etchant to dissolve and remove non-superconductive substances contained therein. Etchants which can be used include acids, such as $HNO_3$, $HCl$, $H_2SO_4$, $H_3PO_4$, $CH_3COOH$, and $HF$, and mixed solutions containing these acids.

We claim:

1. A process for producing a superconductor which comprises the steps of:
    (1) fabricating a combination of any one of niobium and vanadium and an easily deformable metal into one piece and working it to produce a composite metallic material;
    (2) heat treating the composite metallic material in the presence of a low melting point component comprising a substance to form a superconductive substance with said any one of niobium and vanadium to form a superconductive substance;
    (3) chemically dissolving and removing non-superconductive substances contained in the composite metallic material to form a powdery superconductive substance;
    (4) placing the powdery superconductive substance in a tube or jacket to form a composite and working the composite into a shape useful as a superconductor.

2. A process as claimed in claim 1, wherein the easily deformable metal is at least one member of copper (Cu), tin (Sn), gallium (Ga), a Cu-Sn alloy, and a Cu-Ga alloy.

3. A process as claimed in claim 2, wherein the working process for producing the composite metallic material and the heat treatment for forming the superconductive substance are repeated at least once.

4. A process as claimed in any of claims 1 to 3, wherein any one of niobium and vanadium is embedded in any one of the Cu-Sn alloy and Cu-Ga alloy, or placed in parallel thereto and fabricated into one piece, and worked to produce the composite metallic material.

5. A process as claimed in any of claims 1 to 3, wherein any one of niobium and vanadium is embedded in the Cu-base metal or placed in parallel thereto, and worked so as to reduce the cross-sectional area and, thereafter, any one of tin and gallium is deposited thereon to produce a composite metallic material.

6. A process as claimed in any of claims 1 to 3, wherein any one of niobium and vanadium is embedded in at least one member of the Cu-Sn alloy and Cu-Ga alloy, or placed in parallel thereto and fabricated into one piece, and worked into a wire or belt-like form and, thereafter, any one of tin and gallium is deposited thereon to produce a composite metallic material.

7. A process as claimed in any of claims 1 to 3, wherein the superconductive powdery substance after chemical dissolving step (3) is ground into a finer powder form.

8. A process for producing superconductor which comprises the steps of:
    (1) working a composite metal comprising a niobium or vanadium high melting point component and an easily deformable metal so as to reduce the cross-sectional area of the composite metal to produce a composite metallic wire material;
    (2) removing the easily deformable metal from the composite metallic wire material by chemical treatment to form a niobium or vanadium-base metallic fiber;
    (3) depositing a tin or gallium-base low melting point component on the metallic fiber, applying heat treating to form a superconductive substance fiber;
    (4) grinding the superconductive substance fiber to form a powdery superconductive compound;
    (5) placing the powdery superconductive compound in a tube or jacket to form a composite and working the composite into a shape useful as a superconductor.

9. A process as claimed in claim 8, wherein the heat treatment includes a step of depositing on the niobium or vanadium-base metallic fiber a powdery or fibrous tin or gallium-base metal.

10. A process as claimed in claim 8, wherein the heat treatment includes a step of depositing tin or gallium on the niobium or vanadium-base metallic fiber by electrodeposition, vacuum deposition, deposition or the like.

* * * * *